(12) United States Patent
Bartley et al.

(10) Patent No.: US 7,468,993 B2
(45) Date of Patent: Dec. 23, 2008

(54) DYNAMIC RECONFIGURATION OF SOLID STATE MEMORY DEVICE TO REPLICATE AND TIME MULTIPLEX DATA OVER MULTIPLE DATA INTERFACES

(75) Inventors: Gerald Keith Bartley, Rochester, MN (US); John Michael Borkenhagen, Rochester, MN (US); William Paul Hovis, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 642 days.

(21) Appl. No.: 11/035,555

(22) Filed: Jan. 14, 2005

(65) Prior Publication Data

US 2006/0158917 A1 Jul. 20, 2006

(51) Int. Cl.
*H04J 3/02* (2006.01)
(52) U.S. Cl. .......................... 370/537; 714/773; 365/63
(58) Field of Classification Search ....................... None
See application file for complete search history.

(56) References Cited

U.S. PATENT DOCUMENTS

| 4,357,703 A | 11/1982 | Van Brunt |
| 2001/0018728 A1* | 8/2001 | Topham et al. ............... 711/113 |
| 2005/0149578 A1* | 7/2005 | Sustman et al. ............. 707/200 |

* cited by examiner

*Primary Examiner*—Duc C Ho
(74) *Attorney, Agent, or Firm*—Wood Herron & Evans, LLP

(57) ABSTRACT

Multiple interfaces dedicated to individual logic circuits such as memory arrays are capable of being dynamically reconfigured from operating separately and in parallel to operating in a more collective manner to ensure that data associated with all of the logic circuits will be communicated irrespective of a failure in any of the interfaces. Specifically, a plurality of interfaces, each of which being ordinarily configured to communicate data associated with an associated logic circuit in parallel with the other interfaces, may be dynamically reconfigured, e.g., in response to a detected failure in one or more of the interfaces, to communicate data associated with each of the interfaces over each of at least a subset of the interfaces in a time multiplexed and replicated manner.

6 Claims, 4 Drawing Sheets

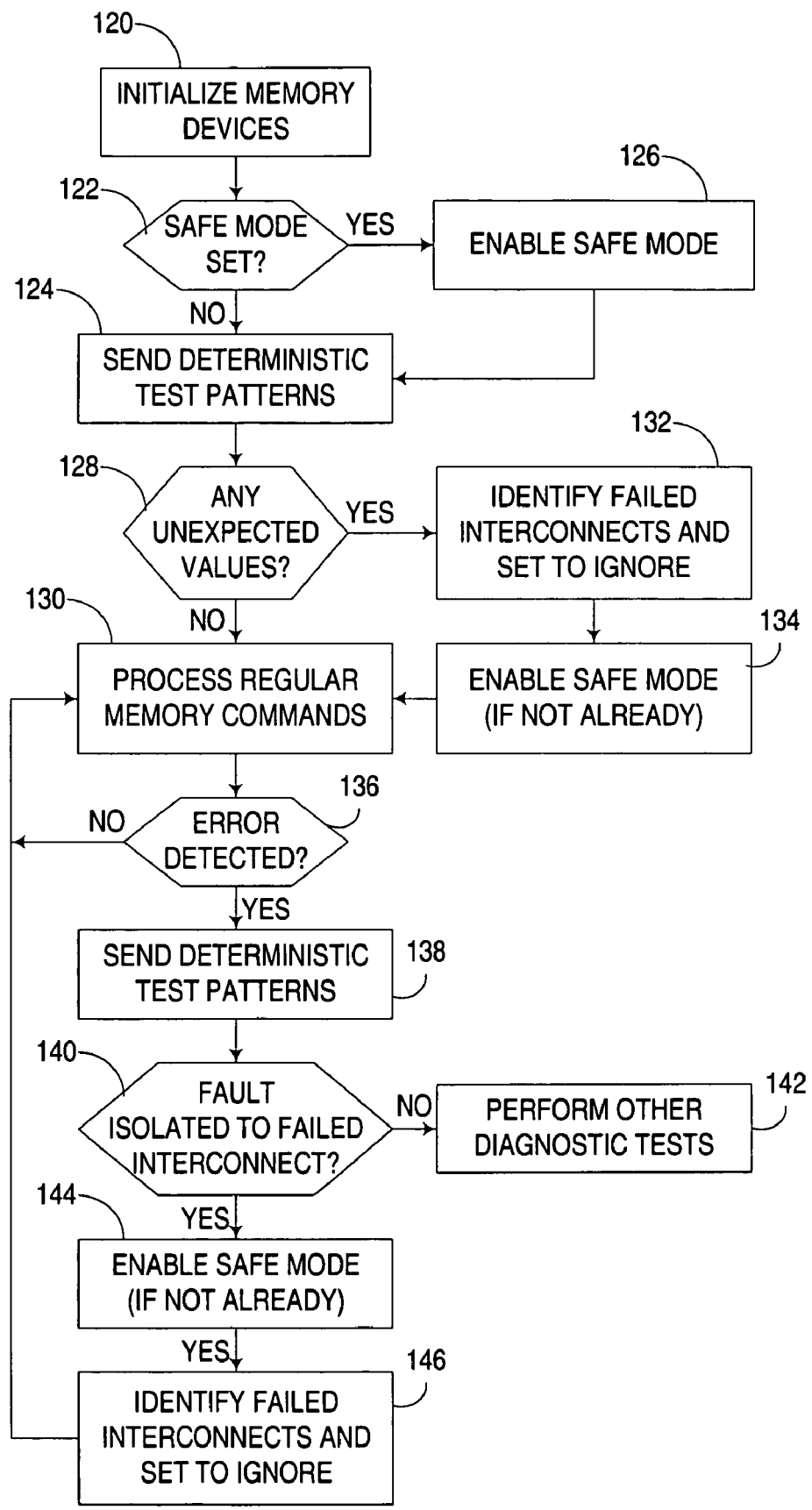

DYNAMIC RECONFIGURATION OF SOLID STATE MEMORY DEVICE TO REPLICATE AND TIME MULTIPLEX DATA OVER MULTIPLE DATA INTERFACES

FIELD OF THE INVENTION

The invention relates to computers and data processing systems, and in particular to performing verifying write operations processed by memory devices utilized in such computers and data processing systems.

BACKGROUND OF THE INVENTION

Ensuring the integrity of data processed by a data processing system such as a computer or like electronic device is critical for the reliable operation of such a system. Data integrity is of particular concern, for example, in fault tolerant applications such as servers, databases, scientific computers, and the like, where any errors whatsoever could jeopardize the accuracy of complex operations and/or cause system crashes that affect large numbers of users.

Data integrity issues are a concern, for example, for many solid state memory arrays such as those used as the main working storage repository for a data processing system. Solid state memory arrays are typically implemented using multiple integrated circuit memory devices such as static or dynamic random access memory (SRAM or DRAM) devices, and are controlled via memory controllers typically disposed on separate integrated circuit devices and coupled thereto via a memory bus. Solid state memory arrays may also be used in embedded applications, e.g., as cache memories or buffers on logic circuitry such as a processor chip.

A significant amount of effort has been directed toward detecting and correcting errors in memory devices during power up of a data processing system, as well as during the normal operation of such a system. It is desirable, for example, to enable a data processing system to, whenever possible, detect and correct any errors automatically, without requiring a system administrator or other user to manually perform any repairs. It is also desirable for any such corrections to be performed in such a fashion that the system remains up and running. Often such characteristics are expensive and only available on complex, high performance data processing systems. Furthermore, in many instances, many types of errors go beyond the ability of a conventional system to do anything other than "crash" and require a physical repair before normal device operation can be restored.

Conventional error detection and correction mechanisms for solid state memory devices typically rely on parity bits or checksums to detect inconsistencies in data as it is retrieved from memory. Furthermore, through the use of Error Correcting Codes (ECC's) or other correction algorithms, it is possible to correct some errors, e.g., single-bit errors up to single-device errors, and recreate the proper data.

In addition, some conventional correction mechanisms for solid state arrays may be capable of disabling defective devices or utilizing redundant capacity within a memory system to isolate errors and permit continued operation of a data processing system. For example, steering may be used to effectively swap out a defective memory device with a spare memory device. One drawback associated with using redundant capacity, however, is the need for redundant devices to be installed in an operating environment, which can add cost and complexity to a system for components that may never be used.

One particular area where it would be particularly desirable to provide improved error detection and correction relates to failed data lines or interfaces used with a memory device. Data lines can go bad between devices due to shorts, opens, increased resistance, or various forms of coupled noise, which can often lead to system failures. Sometimes it may take the contribution of more than one of these factors to cause a failure to occur.

Whenever a data line fails, e.g., within a memory device, within a memory controller and/or within a signal path therebetween, often the data accessed via the data line, e.g., the data stored in a memory array, may still be valid and uncorrupted. However, with a failure in a data line coupled to a memory array, the data in the memory array typically becomes inaccessible externally from the memory device.

In addition, in some memory systems, individual memory devices are provided with multiple memory arrays, with separate data lines dedicated to each array on the device. For example, a synchronous DRAM (SDRAM) with four memory arrays may be designated as an x4 device, with one data line dedicated to each array, resulting in a total of four data lines. With the failure of only one data line, however, an entire memory device typically becomes compromised, even if the other data lines continue to operate normally. ECC is often available to correct and detect errors in such a circumstance, however, whenever a failed data line occurs, a risk exists that another error may arise in another area of the system and expose the memory device to unrecoverable errors that may lead to data corruption and/or system failure.

Therefore, a significant need continues to exist in the art for a manner of addressing failures in a data interfaces used with memory devices and other logic circuits.

SUMMARY OF THE INVENTION

The invention addresses these and other problems associated with the prior art by utilizing interfaces to logic circuits such as memory arrays that are capable of being dynamically reconfigured from operating separately and in parallel to operating in a more collective manner to ensure that data associated with all of the logic circuits will be communicated irrespective of a failure in any of the interfaces. Specifically, a plurality of interfaces, each of which being ordinarily configured to communicate data associated with an associated logic circuit in parallel with the other interfaces, may be dynamically reconfigured, e.g., in response to a detected failure in one or more of the interfaces, to communicate data associated with each of the interfaces over each of at least a subset of the interfaces in a time multiplexed and replicated manner.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIGS. 5A and 5B respectively illustrate the communication of burst data using the solid state memory device of FIG. 3 when operating respectively in normal and safe modes.

FIG. 7 is a flowchart illustrating an exemplary sequence of steps utilized in operating the solid state memory device of FIG. 3.

DETAILED DESCRIPTION

Figure 1:
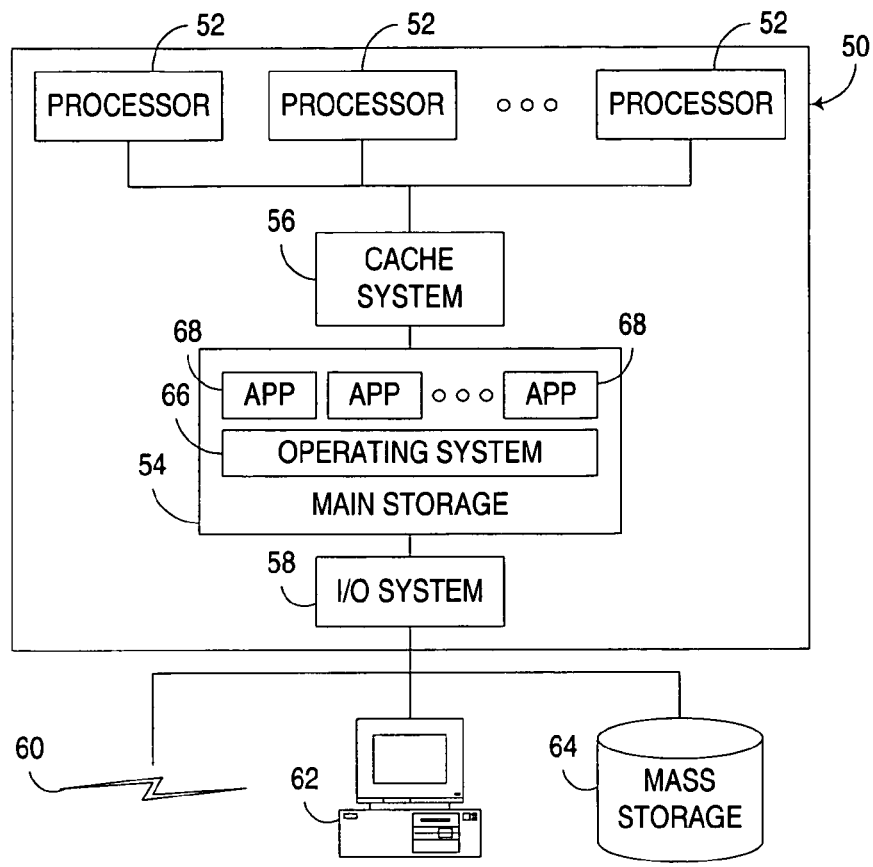
FIG. 1 is a block diagram of an exemplary apparatus with a memory architecture supporting dynamic reconfiguration consistent with the invention.

The embodiments discussed and illustrated hereinafter utilize dynamic reconfiguration of multiple interfaces to enable time multiplexing and replication of data associated with multiple logic circuits over the multiple interfaces. An interface, within the context of the invention, may include one or more signal paths coupled to a logic circuit and used to communicate data between the logic circuit and another circuit. An interface may be internal to an integrated circuit chip and/or coupled between chips or other devices, and may utilize any number of communication protocols and transmission media. Furthermore, an interface may be able to communicate data elements as small as one bit, or data elements including multiple bits of information.

As will become more apparent below, an interface as used herein is typically dedicated to a specific logic circuit, such that multiple interfaces dedicated to multiple logic circuits may be used to communicate data associated with the various logic circuits in parallel. In the embodiments discussed hereinafter, for example, the logic circuits are implemented as memory arrays in a solid state memory device such as a synchronous dynamic random access memory (SDRAM), whereby the interfaces are data lines dedicated to and associated with individual memory arrays. It will be appreciated, however, that the invention may be utilized in other applications where data associated with multiple logic circuits other than memory arrays is communicated in parallel by multiple interfaces. Furthermore, while interfaces in the illustrated embodiments are typically dedicated at all times to specific logic circuits, it will be appreciated that in other embodiments interfaces may be dedicated to specific logic circuits only when specifically configured as such.

Embodiments consistent with the invention incorporate dynamic reconfiguration of the interfaces associated with multiple logic circuits to in effect provide a mode of operation whereby data is replicated and time multiplexed over multiple interfaces to ensure that data associated with every logic circuit will be communicated by at least one of the interfaces, thus preventing a failure in any of the interfaces to limit external access to the logic circuit to which a failed interface is dedicated.

Replicated, in the context of the invention, means that data associated with a particular memory array or logic circuit is routed over multiple interfaces, including at least one interface that is not dedicated to that particular memory array. In addition, time multiplexed, in the context of the invention, means that data associated with different memory arrays or logic circuits is communicated over a particular interface at different points of time. Taken together, these terms describe an implementation whereby, for a given set of data that includes data associated with multiple memory arrays or logic circuits, the set of data will be communicated in its entirety over multiple interfaces. Of note, however, these terms do not require that the data associated with a given memory array or logic circuit be communicated over multiple interfaces at the exact same time, or that data associated with multiple memory arrays or logic circuits be communicated over multiple interfaces in the exact same sequence. Furthermore, the fact that an implementation may attempt to communicate data over all of the interfaces does not necessarily mean that all of such data communications are successful, as an attempt to communicate data over a failed interface will often be unsuccessful, and indeed, it is often due to the likelihood of such communications being unsuccessful that it becomes desirable to replicate the data on some or all of the other interfaces to ensure the data is successfully communicated by at least one of the interfaces.

Through replicating and time multiplexing data associated with multiple logic circuits or memory arrays over multiple interfaces, it is ensured that data associated with each of the logic circuits will be communicated over at least one non-failed interface. As such, a failure in one or more interfaces can often be accommodated so long as at least one non-failed interface remains active.

Dynamic reconfiguration consistent with the invention may be initiated in a number of manners, e.g., in response to assertion of a control signal, communication of a command over a command bus, writing a value to a register or memory address, etc. Typically, dynamic reconfiguration is associated with a dedicated mode of operation that is distinguished from regular or ordinary operation, e.g., a "safe" mode that is entered whenever a failure in one or more interfaces is detected.

Typically, whenever a safe or like mode is selected, devices at each end of a set of interfaces are configured to send and receive data according to an agreed upon protocol. Moreover, as will become more apparent below, a voting protocol may be used to select the proper value for the data being communicated over multiple interfaces.

In addition, in some embodiments consistent with the invention, if one side of a set of interfaces communicates with many devices in parallel (as may be the case where a multi-drop memory bus is used to interface a memory controller with a plurality of memory devices, dynamic reconfiguration may be applied to each device in parallel even if a failure is associated with only one device. It will also be appreciated that the invention may be used in some embodiments in parallel with ECC, redundancy or spare algorithms, data mirroring, scrubbing, complement-recomplement, test modes, and other known techniques to detect and fix data errors. Although in many instances dynamic reconfiguration will have adverse implications on system performance, since multiple interfaces no longer transmit different data in parallel, dynamic reconfiguration may enable a system to continue to operate without requiring immediate repair of a failure.

Turning now to the Drawings, wherein like numbers denote like parts throughout the several views, FIG. 1 illustrates a computer 50 that represents one suitable environment within which dynamic reconfiguration may be implemented in a manner consistent with the invention. Computer 50 generically represents, for example, any of a number of multi-user computers such as a network server, a midrange computer, a mainframe computer, etc. However, it should be appreciated that the invention may be implemented in practically any device capable of utilizing solid state memory devices, including other computers and data processing systems, e.g., in single-user computers such as workstations, desktop computers, portable computers, and the like, or in other programmable electronic devices (e.g., incorporating embedded controllers and the like), such as set top boxes, game machines, etc.

Computer 50 generally includes one or more processors 52 coupled to a main storage 54 through one or more levels of cache memory disposed within a cache system 56. In some embodiments each processor 52 may include multiple processing cores. Furthermore, main storage 54 is coupled to a number of types of external devices via a system input/output (I/O) system 58, e.g., one or more networks 60, one or more workstations 62 and one or more mass storage devices 64. Any number of alternate computer architectures may be used in the alternative.

Also shown resident in main storage 54 is a typical software configuration for computer 50, including an operating system 66 (which may include various components such as kernels, device drivers, runtime libraries, etc.) accessible by one or more applications 68.

Computer 50, or any subset of components therein, may also be referred to hereinafter as an "apparatus". It should be recognized that the term "apparatus" may be considered to incorporate various data processing systems such as computers and other electronic devices, as well as various components within such systems, including individual integrated circuit devices or combinations thereof. Moreover, within an apparatus may be incorporated one or more logic circuits that circuit arrangements, typically implemented on one or more integrated circuit devices, and optionally including additional discrete components interfaced therewith.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, Verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy disks, hard disk drives, CD-ROM's, and DVD's, among others, and transmission type media such as digital and analog communications links.

Figure 2:
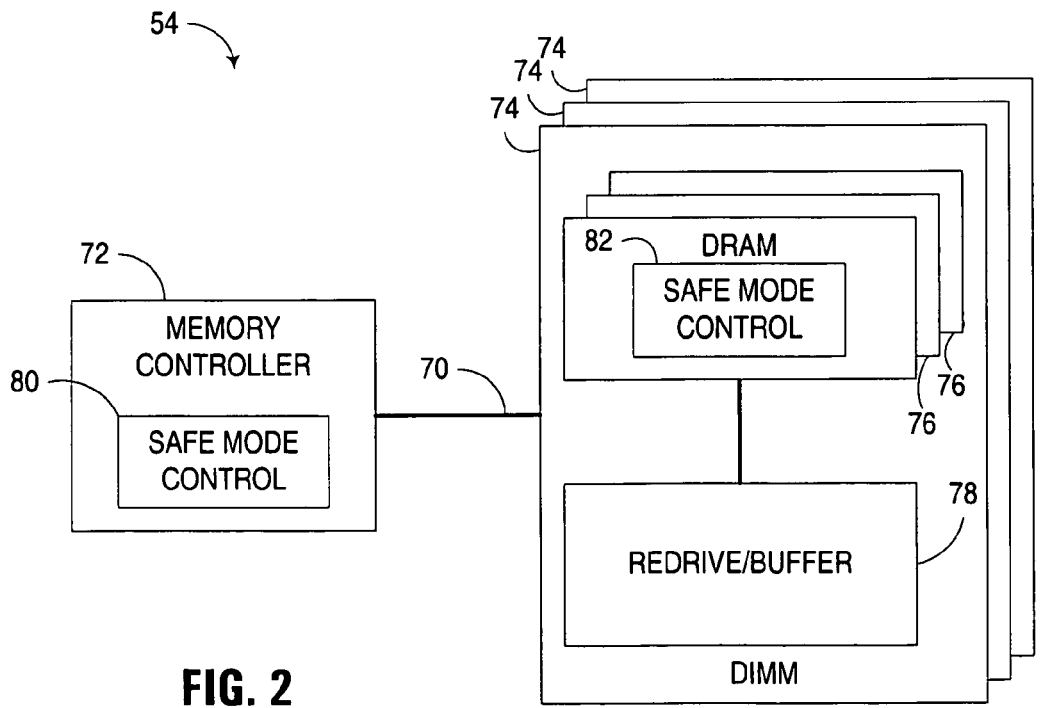
FIG. 2 is a block diagram an exemplary implementation of a main storage memory architecture in the apparatus of FIG. 1.

FIG. 2 next illustrates an exemplary memory architecture for main storage 54, including a memory bus 70 coupling together a memory controller 72 with a plurality of memory modules (e.g., Dual Inline Memory Modules, or DIMM's) 74. Each memory module 74 is typically implemented using a printed circuit board or card upon which is disposed a plurality of dynamic random access memory (DRAM) memory devices 76, and optionally additional interface circuitry, such as a redrive/buffer device 78. Furthermore, to support dynamic reconfiguration consistent with the invention safe mode control logic 80 is disposed in memory controller 72, with complementary safe mode control logic 82 disposed in each DRAM 76. In other embodiments, safe mode control logic may be disposed in a separate chip, or in redrive/buffer devices 78.

In an SDRAM environment, e.g., a DDR2 SDRAM environment, each memory module may be coupled in parallel to memory bus 70, and may include a redrive device that redrives the address and control lines from memory bus 70 to each memory device, leaving the data lines coupled directly to memory bus 70.

As another example, in a fully buffered DIMM (FB-DIMM) environment, memory modules 74 may be coupled to one another in a daisy chain arrangement, and each memory module may incorporate an Advanced Memory Buffer (AMB) device suitable for redriving the data, address and control lines from the memory bus to each memory device, as well as to drive subsequent FB-DIMM memory modules in the daisy chain arrangement consistent with the FB-DIMM specification.

Memory controller 72 may be a dedicated device, or alternatively, may be incorporated into a composite device, e.g., including one or more embedded caches and/or one or more cache controllers used to drive an external cache. Memory controller 72 may also be combined with other "chipset"-related components, e.g., system I/O components, PCI interface components, etc. Furthermore, memory controller 72 may be embedded in a processor device in some implementations. Furthermore, in some implementations a memory device may be an embedded array that is integrated onto the same integrated circuit as a memory controller, processor or other logic device.

It will be appreciated that dynamic reconfiguration consistent with the invention may be implemented in connection with practically any memory architecture. Moreover, it will be appreciated that dynamic reconfiguration may be implemented at different levels in a memory hierarchy. As such, the invention is not limited to the particular memory architectures described specifically herein.

Figure 3:
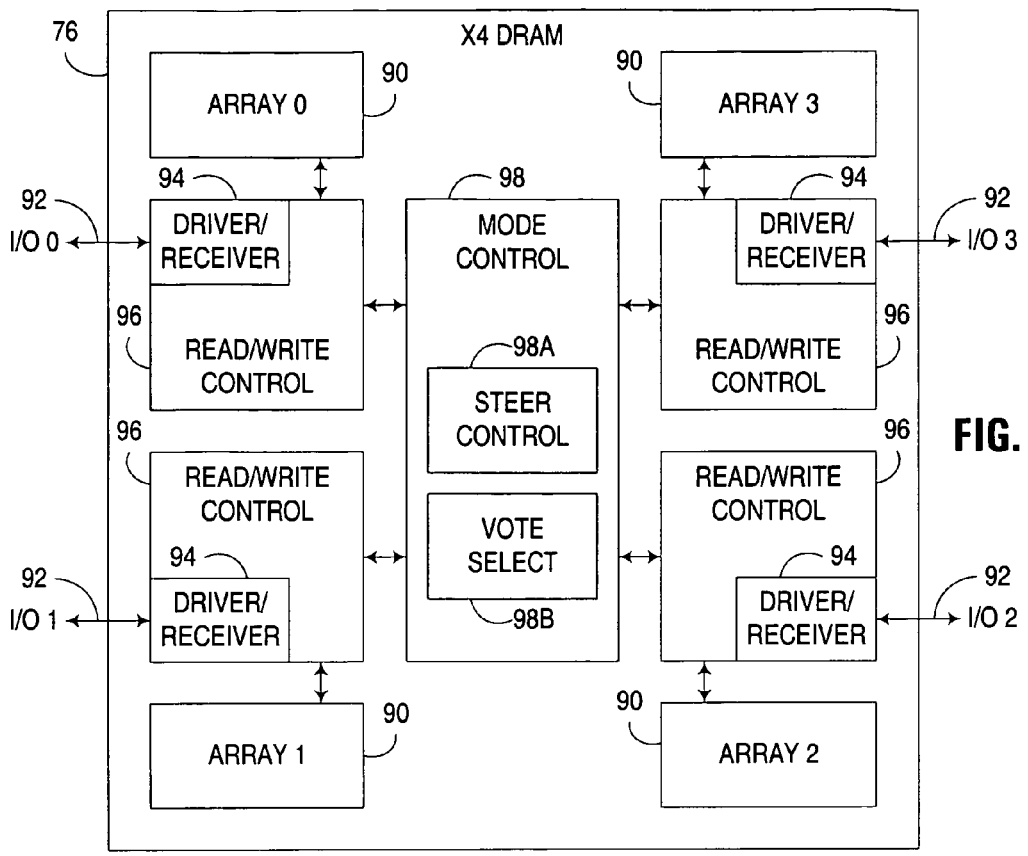
FIG. 3 is a block diagram of one exemplary implementation of a solid state memory device from the architecture of FIG. 2.

FIG. 3 next illustrates one possible implementation of each DRAM 76, in this embodiment an x4 SDRAM that supports four memory arrays 90 with individual dedicated input/output (I/O) data lines 92. Each I/O data line 92 is coupled to a driver/receiver block 94 in a read/write control block 96, which is in turn coupled to the respective array 90.

In normal operation, each I/O data line 92 in DRAM 76 is configured to transmit write data to, and receive read data from, the particular memory array 90 to which the I/O data line 92 is dedicated. To support dynamic reconfiguration, however, each I/O data line 92 is additionally configured to communicate with every memory array 90 when in a designated safe mode. Routing of data between I/O data pins 92 and memory arrays 90, as well as management of safe mode operation, is provided by a mode control block 98 interfaced between each of read/write control blocks 96. Mode control block 98 manages the operation of DRAM 76 in normal and safe modes, and initiates dynamic reconfiguration to switch the DRAM between the modes. Mode control block 98 also implements a number of functions associated with dynamic reconfiguration, including steering data between I/O data lines and memory arrays (e.g., as managed by steer control logic 98A), and voting selection and control (e.g., as managed by vote select logic 98B). Block 98 may also include additional functionality, e.g., to repower the data signals passed between the various arrays and I/O data lines.

Figure 4:
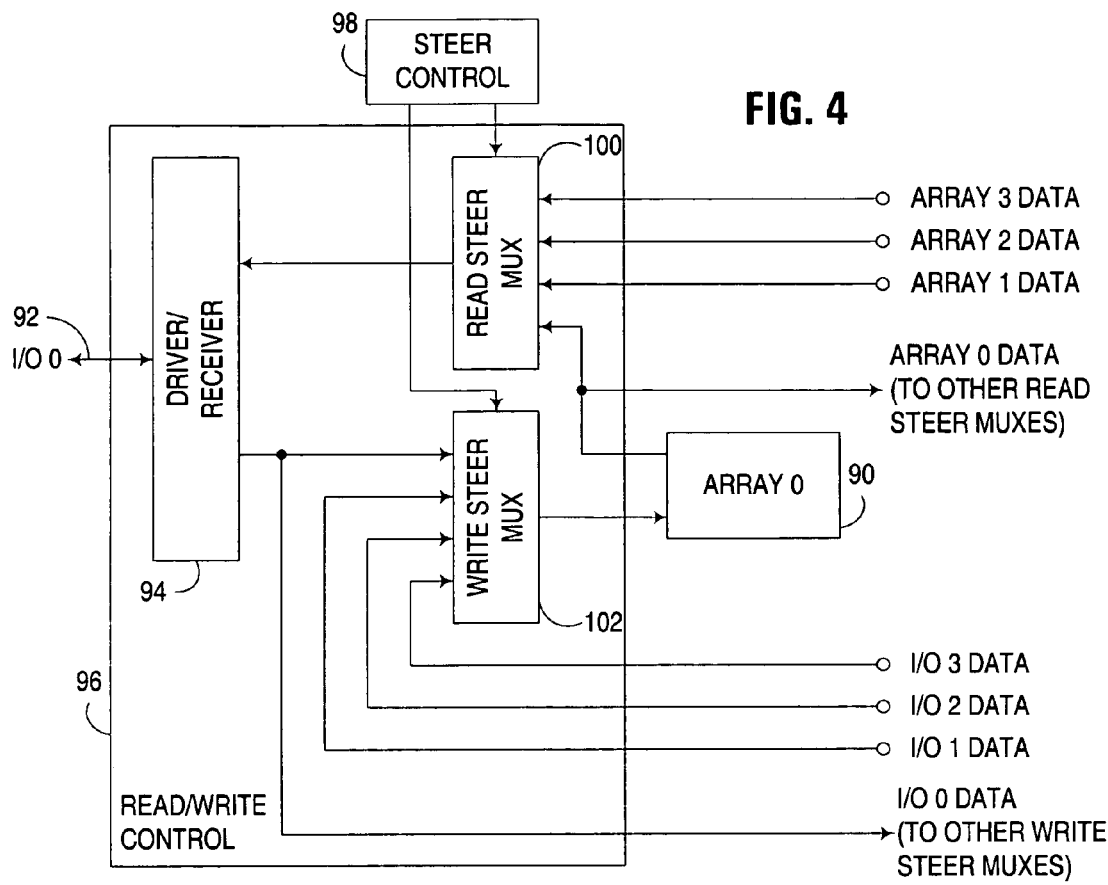
FIG. 4 is a block diagram of data routing logic added to the read/write control logic of the solid state memory device of FIG. 3 to support dynamic reconfiguration consistent with the invention.

FIG. 4 illustrates in greater detail one manner in which each of a plurality of I/O data lines 92 may be interfaced with a particular a memory array 90 to support dynamic reconfiguration consistent with the invention. In particular, each read/write control block may be provided with additional read and write steer multiplexers 100, 102 interposed between memory array 90 and I/O data line 92. Read steer multiplexer 100 includes four inputs that are selectively routed to a single output that is provided to driver/receiver block 94, and ultimately, over I/O data line 92. One of the inputs is coupled to the output of an associated memory array 90 that supplies read data to multiplexer 100, as well as to the read steer multiplexers associated with the other memory arrays in the memory device. The other three inputs of read steer multiplexer 100 are coupled to the outputs of the other three memory arrays in the device (not shown in FIG. 4). Likewise, write steer multiplexer 102 includes four inputs that are selectively routed to a single output that is provided to an input to memory array 90. One of the inputs is coupled to receive write data communicated over I/O data line 92. The other three inputs are coupled to the other three I/O data lines provided within the device (also not shown in FIG. 4).

To route desired data between a specific I/O data line and a specific array, each of multiplexers 100, 102 is provided a select signal from mode control block 98. To further illustrate this concept, FIGS. 5A and 5B illustrate exemplary communications of a set of data using computer 50, with the memory subsystem thereof respectively operating in normal and safe modes. Assuming, for example, that DRAM's 76 are x4 devices configured to operate in a burst 4 mode, FIG. 5A illustrates a normal mode burst data transfer over I/O data lines 0-3. Each data element transferred is designated by a letter A-D, representing the dedicated I/O data line over which the data element is normally transferred, and the memory array being written to or read from during the transfer, as well as a number 1-4, representing the burst phase during which the data element is being transferred. As an example, for data element C2, the designation C means the data element is transferred over I/O data line 2 to or from memory array 2, while the designation 2 means the data element is transferred during the second burst phase of a four phase burst.

As may be seen in FIG. 5A, therefore, during normal operation I/O data line 0 transfers four data elements A1-A4 during a four phase burst, while I/O data line 1 transfers four data elements B1-B4, I/O data line 2 transfers four data elements C1-C4, and I/O data line 3 transfers four data elements D1-D4.

Consistent with the invention, however, when in safe mode, all of the data elements A1-A4, B1-B4, C1-C4, and D1-D4 are transferred over each of the I/O data lines 0-3. As such, on the first burst phase, all four I/O data lines transfer data element A1, on the second burst phase, all four I/O data lines transfer data element A2, etc. The resulting transfer will take 4× as long as a normal mode transfer, however, so long as at least one I/O data line has not failed, all of the data will be successfully communicated.

It will be appreciated that the data elements A1-A4, B1-B4, C1-C4 and D1-D4 may be communicated in sequence in some embodiments, while in other embodiments, the data elements may be communicated in different sequences. Moreover, it will be appreciated that each I/O data line may communicate the data elements in a different sequence from the other I/O data lines in other embodiments.

When data is communicated over an I/O data line when in safe mode, various mechanisms can be used to decode the correct/valid data. For example, in the illustrated embodiment it is desirable to utilize selection logic that implements a voting protocol whereby the data elements communicated over each I/O data line are looked at, with majority voting used to determine the valid data from the replicated data communicated over all of the I/O data lines. Moreover, for I/O data lines that have been determined to be failed during power up or during normal operation, that I/O data line can be eliminated from the voting pool (i.e., ignored) so that the I/O data line will no longer participate in voting, leaving only the remaining I/O data lines in the voting pool. Of note, data may be buffered up until all bits are received as necessary in some embodiments.

As an example, assume that in an x4 memory device, four I/O data lines 0-3 return values of 0, 0, 1 and 0, respectively. The illustrated embodiment may establish the value as "0" based upon the 3-1 vote favoring that value among the voting pool members. In addition, given the knowledge that only I/O data line 2 returned a different result, it may be determined that the I/O data line exhibiting the different result may be set to ignore and thereafter eliminated from future votes. In many instances, it may be desirable to track inconsistent results by individual I/O data lines and set such data lines to ignore only after a pattern of repeated incorrect results are received.

Typically, so long as more than two non-failed I/O data lines remain on a given device, voting can be used to correct for an error based upon the majority vote. When only two non-failed I/O data lines remain, however, voting may only be able to detect, rather than correct an error. Also, where ECC is used, data errors may be detectable and/or correctable with even fewer non-failed I/O data lines.

It will be appreciated that the voting protocol used to decode data in safe mode is typically disposed at one or both endpoints of a set of interfaces used to communicate memory array data. For read operations, for example, the voting protocol may be implemented in selection logic (e.g., within safe mode control logic 80) in memory controller 72), while for write operations, the voting protocol may be implemented in selection logic (e.g., within safe mode control logic 82) in each DRAM 76. It will be appreciated also that safe mode control logic 80 will typically require compatible voting and data steering/staging as that is shown for DRAM 76 in FIGS. 2-3. In many cases, this compatible logic will need to handle such functionality on behalf of a large number of individual memory devices, with independent evaluation and voting applied to each memory device. Other protocols may be used to determine the correct data being transferred during safe mode operation consistent with the invention.

For memory devices having additional memory arrays, e.g., x8 or x16 memory devices, the aforementioned dynamic reconfiguration circuitry may be used to provide additional fault tolerance, as more failures can be tolerated when eight or sixteen separate I/O data lines are able communicate time multiplexed and replicated data. However, the performance of such systems may be unacceptably low, given that an x8 memory device would typically required 8× the time to complete a transfer when in safe mode, and an x16 device would likewise require 16× the time. Also, implementing dynamic reconfiguration in such instances would typically increase the complexity of the wiring, as well as of the voting, selecting, and steering logic required to implement dynamic reconfiguration in a manner consistent with the invention.

Figure 6:
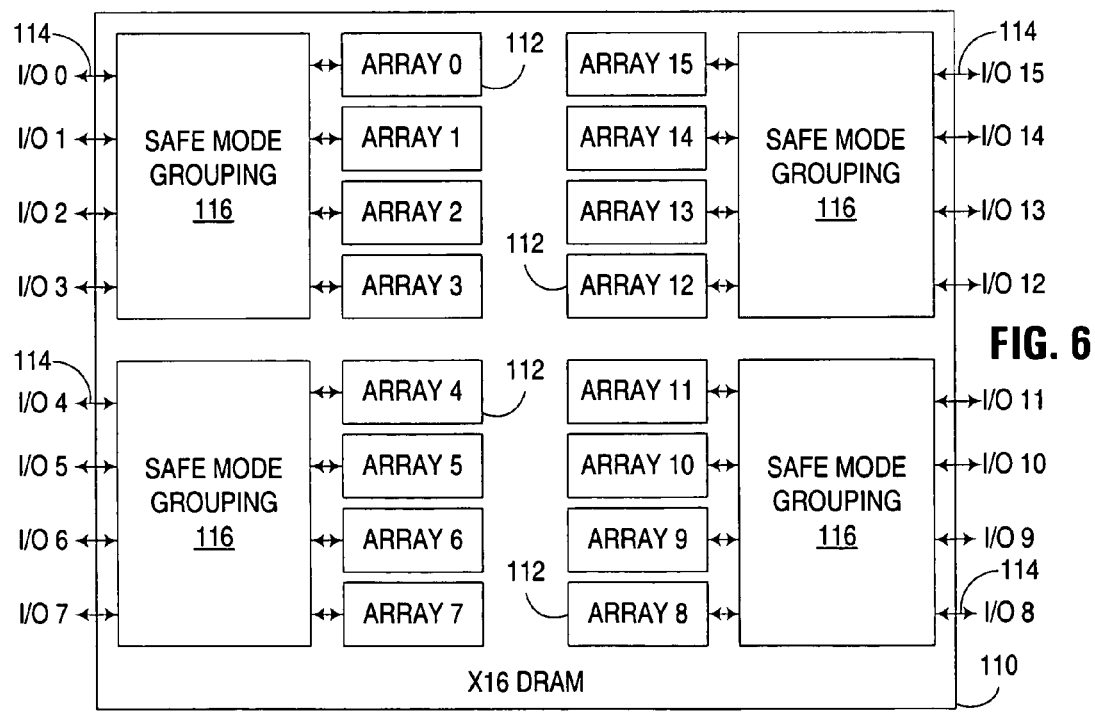
FIG. 6 is a block diagram of another exemplary implementation of a solid state memory device to that of FIG. 3, utilizing safe mode groupings.

In the alternative, as illustrated in FIG. 6, it may be desirable to support "safe mode groupings" representing subsets of arrays and I/O data lines that are logically grouped together and provided with dynamic reconfiguration capability. As shown in the figure, an x16 SDRAM 110 is shown including 16 memory arrays 112 along with 16 dedicated and associated I/O data lines 114. Groups of four memory arrays 112 and dedicated I/O data lines 114 are interfaced by safe mode grouping logic 116, which may be configured in a similar manner to DRAM 76 of FIGS. 3 and 4. While segmenting DRAM 110 in this manner, some of the flexibility in terms of being able to correct for errors would be lost; however, doing so would also avoid the increased transfer time for these wider devices and simplify the wiring and support circuitry required to implement dynamic reconfiguration in such instances.

Safe mode may be enabled in response to different system events. For example, safe mode may be entered as a result of testing performed during initialization of a memory device. Safe mode may also be entered as a result of testing performed during normal operational use of a system, or even in response to detected failures, in lieu of or in addition to, initialization testing.

FIG. 7, for example, illustrates an exemplary flowchart detailing the operation of a main storage incorporating dynamic reconfiguration support consistent with the invention. FIG. 7, in particular, illustrates in block 120 the initialization of memory devices in a system, e.g., during normal power up of the system, which may include defaulting each memory device to operate in a normal mode. After some initialization is performed, it may be determined in block 122 whether the safe mode was previously set due to failure in one of the I/O data lines, e.g., by polling non-volatile information that logs any failed I/O data lines. If so, control passes to block 126 to enable the safe mode, and optionally, set any previously-identified failed I/O data lines to a state where those failed data lines will be ignored by the voting protocol.

If block 122 determines the safe mode is not set, or after execution of block 126, control passes to block 124 to test for deterministic patterns over each I/O data line. For example, it may be desirable for test logic in a controller to drive a "00" or a "11" pattern along with issuing a vote check command over the command bus to eliminate any data lines determined to be failed. Data lines that are bad due to shorts/opens will invariably see either a "00" or "11" pattern, and as a result will be taken out of the voting pool.

For example, in one implementation consistent with the invention a vote check command may be issued over a command bus coupled between memory controller 72 and DRAM's 76. Table I illustrates the expected results of such a command in the event that the vote check command passes with no identified failed data lines, while Table II illustrates the expected results of such a command in the event that the vote check command fails with at least one identified failed data line.

TABLE I

Passing Vote Check Command

| Cycle Number | Command Bus | Address Bus | Data Bus | Action (at DRAM) |
|---|---|---|---|---|
| 1 (do check) | Vote/Check Eliminate Cmd (may use MRS/EMRS | MRS/EMRS as needed | N/A | N/A |
| 2 (passing check) | No command | N/A | "0" all bits | expected value, leave all I/O's in voting pool |
| 3 (passing check) | No command | N/A | "1" all bits | expected value, leave all I/O's in voting pool |

TABLE II

Failing Vote Check Command

| Cycle Number | Command Bus | Address Bus | Data Bus | Action (at DRAM) |
|---|---|---|---|---|
| 1 (do check) | Vote/Check Eliminate Cmd (may use MRS/EMRS | MRS/EMRS as needed | N/A | N/A |
| 2 (failing check) | No command | N/A | "0" on I/O's 0-2, "1" on IO 3 | expected value I/O's 0-2, leave in voting pool, eliminate I/O 3 from voting |
| 3 (failing check) | No command | N/A | "0" on I/O 0, "1" on bits I/0 1-3 | eliminate I/O 0 from voting, expected value on I/O's 1-2, leave in voting pool |

It may be determined in block 128, as a result of the test patterns, whether any unexpected values were obtained. If so, control passes to block 132 to identify any failed interconnects in the manner discussed above, and set those interconnects to "ignore" so that they are not considered during the vote protocol, either as a potential source of correct data, or as a voting member. This operation can be viewed as simply taking known bad elements out of the voting process so that the remaining good items can be made that much more effective. Errors found in diagnostic testing may be used, for example, by the memory device to eliminate one or more I/O's from the voting pool. Normally all I/O/s would participate in voting once safe mode was invoked. However, a diagnostic test that detected an error may then result in a command to all devices that selected I/O's are to be removed from the voting pool. All I/O's that have a vote fail may also be marked as eliminated at a receiving memory device level.

After completion of block 132, control then passes to block 134 to enable the safe mode, if not already done previously. Control then passes to block 130 to being processing regular memory commands. Returning to block 128, if no unexpected values are obtained during the execution of block 128, then control passes directly to block 130.

Block 130 then processes regular memory commands, checking for errors as illustrated in block 136. As long as no errors are detected, block 136 returns control to block 130.

Otherwise, if errors are detected, block 136 may pass control to block 138 to send deterministic test patterns to potential identify the source of the new error. Block 140, in particular, attempts to determine if the fault can be isolated to a particular failed interconnect, or if another component may be the cause of the error. In the latter instance, control passes to block 142 to perform other diagnostic testing as appropriate, which may result in performing other corrective actions, e.g., redundant steering or swapping, or shutting down and/or restarting the entire system.

If block 140 determines the error is isolated to a failed interconnect, then block 140 passes control to block 144 to enable the safe mode (if not already done at this point), and then to block 146 to attempt to identify any failed interconnects and set those interconnects to ignore, similar to block 132. Control then returns to block 130 to process additional memory commands. Of note, therefore, both initialization and runtime testing are incorporated into the flowchart of FIG. 7. In the alternative, as noted above, testing during initialization and/or runtime may be omitted in some embodiments without departing from the spirit and scope of the invention.

It will be appreciated that implementation of the functionality described above in one or more integrated circuits would be well within the abilities of one of ordinary skill in the art having the benefit of the instant disclosure. It will also be appreciated that various additional modifications may be made to the illustrated embodiments consistent with the invention. Therefore, the invention lies in the claims hereinafter appended.

What is claimed is:

1. A method of communicating data over a plurality of interfaces, wherein each interface is configured to communicate data associated with a respective logic circuit among a plurality of logic circuits, the method comprising:
   communicating data associated with the plurality of logic circuits in parallel over the plurality of interfaces; and
   after communicating the data associated with the plurality of logic circuits in parallel over the plurality of interfaces, dynamically reconfiguring the plurality of interfaces to time multiplex and replicate data associated with each of the plurality of logic circuits over multiple interfaces from the plurality of interfaces.

2. The method of claim 1, wherein each interface is dedicated to the respective logic circuit with which the interface is associated prior to being dynamically reconfigured.

3. The method of claim 1, wherein each logic circuit comprises a memory array, and wherein each interface comprises a data interconnect.

4. The method of claim 3, further comprising selecting valid data from the replicated data communicated by the plurality of interfaces.

5. The method of claim 4, wherein selecting the valid data includes selecting the valid data according to a voting protocol.

6. The method of claim 3, further comprising communicating deterministic data patterns over the plurality of interfaces to identify a failed interface.

* * * * *